(12) United States Patent
Lee (10) Patent No.: US 6,174,774 B1
(45) Date of Patent: *Jan. 16, 2001

(54) METHOD OF FABRICATING SEMICONDUCTOR DEVICE

(75) Inventor: Chang-Jae Lee, Cheongju-si (KR)

(73) Assignee: LG Semicon Co., Ltd., Chungcheongbuk-Do (KR)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/026,690

(22) Filed: Feb. 20, 1998

(30) Foreign Application Priority Data

Mar. 12, 1997 (KR) .................................. 97/8321

(51) Int. Cl.⁷ .................................................. H01L 21/336
(52) U.S. Cl. ............................ 438/279; 438/257; 438/275
(58) Field of Search .................................. 438/159, 257, 438/258, 263, 264, 266, 275, 279, 282, 283, 284, 303, 305, 306

(56) References Cited

U.S. PATENT DOCUMENTS

| 5,266,823 | * | 11/1993 | Noji et al. | 257/327 |
| 5,416,036 | * | 5/1995 | Hsue | 438/275 |
| 5,547,893 | * | 8/1996 | Sung | 438/207 |
| 5,792,684 | * | 8/1998 | Lee et al. | 438/238 |
| 6,001,721 | * | 12/1999 | Huang | 438/597 |

OTHER PUBLICATIONS

Chen, B. et al., "Formation of Colbalt Silicided Shallow Junction Using Implant Into/Through Silicide Technology and Low Temperature Furnace Annealing", IEEE Transactions on Electron Devices, vol. 43, No. 2, Feb. 1996, pp. 258–266.

Parekh, N. et al., "Characterization and Implementation of Self–Aligned TiSi$_2$ in Submicrometer CMOS Technology", IEEE Transactions on Electron Devices, vol. 38, No. 1, Jan. 1991, pp. 88–94.

* cited by examiner

*Primary Examiner*—Chandra Chaudhari
*Assistant Examiner*—Jack Chen
(74) *Attorney, Agent, or Firm*—Morgan, Lewis & Bockius LLP

(57) ABSTRACT

A method of fabricating a semiconductor device having a memory device region and a logic device region on a substrate includes the steps of forming first and second gate lines on the substrate at the memory device region and the logic device region, respectively, forming a sidewall insulating layer on both sides of each of the first and second gate lines, forming a plurality of impurity regions in the substrate, forming a silicon nitride layer on the memory device including the first gate lines, forming a silicide layer on the second gate line and impurity regions at the logic device region, and forming an oxide layer on an exposed surface excluding portions over each one of the impurity regions at the memory region and the logic device region, respectively.

16 Claims, 8 Drawing Sheets

METHOD OF FABRICATING SEMICONDUCTOR DEVICE

This application claims the benefit of Korean Application Number 8321/1997 filed on Mar. 12, 1997, which is hereby incorporated by reference.

BACKGROUND OF THE INVENTION

1. Field of the Invention

The present invention relates to a semiconductor device, and more particularly, to a method of fabricating a semiconductor device. Although the present application is suitable for wide scope of applications, it is particularly suitable for forming a 1 GB DRAM or higher integrated semiconductor memory device.

2. Discussion of the Related Art

Development and research have been directed to DRAM devices capable of processing GB information in a chip. A dimension of a unit device to store a unit of information should be less than 0.3 $\mu m^2$ in a 1 GB DRAM device. Thus, a micro pattern-forming technique is generally required to realize a device having such a precise dimension. For example, a self-aligned contact hole method is one of the techniques for forming the micro patterns. Using this process, a unit cell having a dimension less than 0.3 $\mu m^2$ is readily achieved in forming micro patterns.

With the advent of the multi-media era, electronics have been developed which have improved and more complicated functions. In addition, the trend is towards smaller, lighter, and more portable systems. According to this trend, a multifunction semiconductor device built in one chip has received great attention. Particularly, a DRAM memory device region and logic device region tend to be built in one chip. To realize this design, processes of forming the memory device region and the logic device region should be performed at the same time, rather than separately.

A conventional method of fabricating a semiconductor device will be described with reference to the attached drawings.

FIGS. 1A through 1F are cross-sectional views showing the process steps of forming a memory device region of a DRAM cell, and FIGS. 2A through 2F are cross-sectional views showing the process steps of a method of forming a logic device region. In the conventional method, the memory device region and the logic device region are formed in separate processes.

Figure 1A:
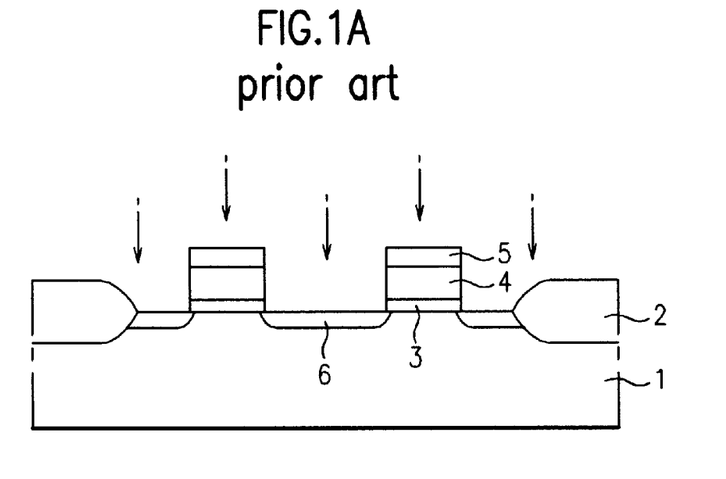
FIGS. 1A through 1F are cross-sectional views showing the process of forming a memory device region of a conventional semiconductor device.

Referring to FIG. 1A, after an active region and a field region are defined in a semiconductor substrate 1, a field oxide layer 2 is formed on the field region. Successively, a first oxide layer, a polysilicon layer, and a first silicon nitride layer (not shown) are formed on the entire surface of the substrate.

A photoresist film is coated thereon and selectively patterned by photolithography. With a photoresist pattern serving as a mask, the first silicon nitride layer, the polysilicon layer, and the first oxide layer are anisotropically etched to form a gate cap nitride layer 5, a gate line 4, and a gate oxide layer 3, respectively. N-type ions are then implanted into the substrate 1 to form a lightly doped drain (LDD) region 6 in the substrate 1.

Figure 1B:
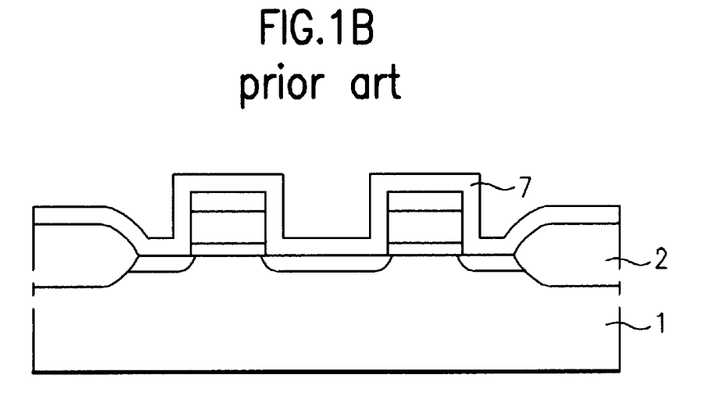

As shown in FIG. 1B, a second silicon nitride layer 7 is deposited on the entire surface of the substrate including the gate cap nitride layer 5, the gate line 4 and the gate oxide layer 3.

Figure 1C:
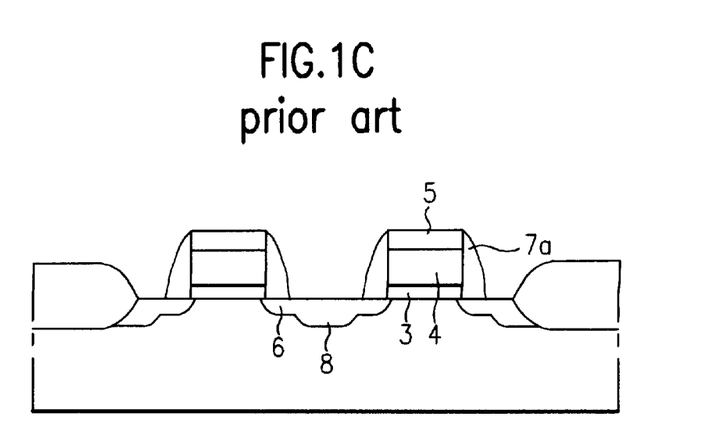

Then, in FIG. 1C, the second silicon nitride layer 7 is anisotropically etched to form a sidewall insulating layer 7a at both sides of the gate oxide layer 3, the gate line 4, and the gate cap nitride layer 5. With the sidewall insulating layer 7a and the gate cap nitride layer 5 serving as masks, heavily doped n-type impurity ions are implanted into the substrate 1 to form a source/drain region 8.

Figure 1D:
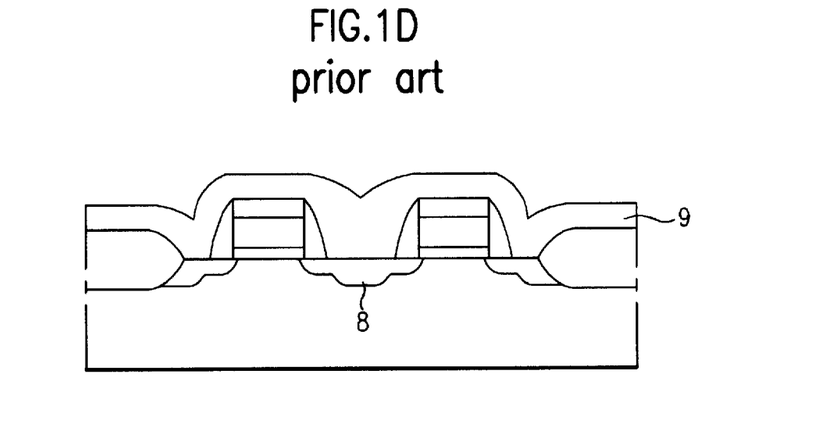
Figure 1E:
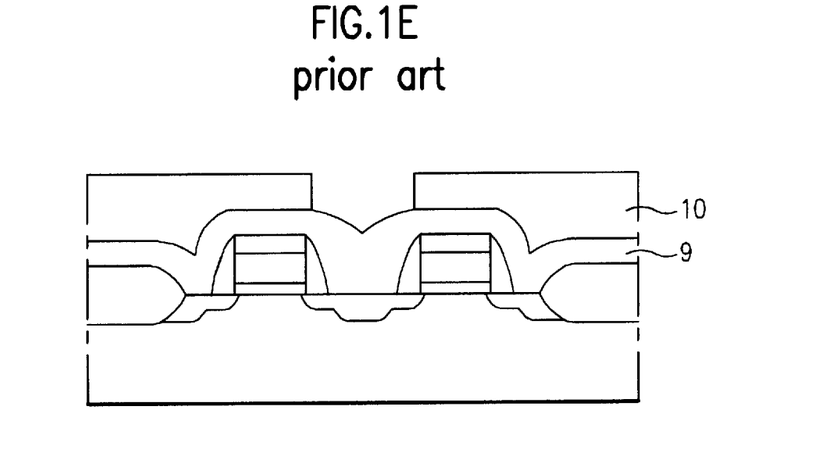

As shown in FIG. 1D, a second oxide layer 9 is deposited on the substrate 1. Next, a photoresist film 10 is coated on the entire surface of the substrate and then patterned by photolithography to expose a portion of the second oxide layer 9, as shown in FIG. 1E.

Figure 1F:
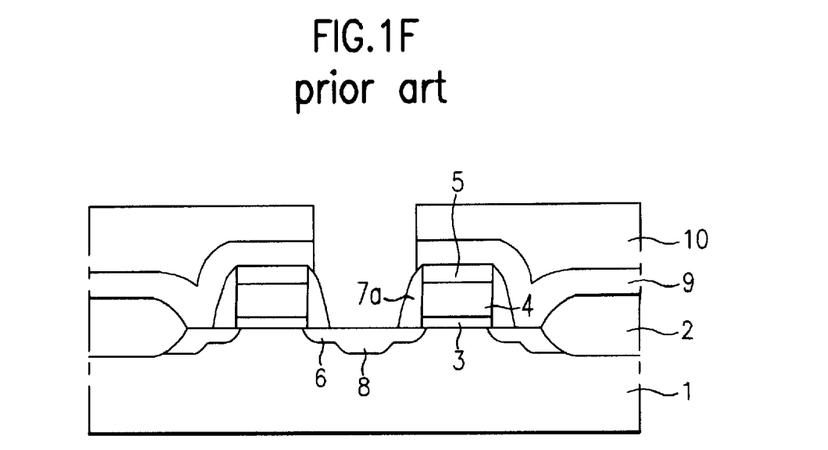

Referring to FIG. 1F, with the photoresist film 10 serving as a mask, the portion of the second oxide layer 9 between the gate lines 4 is removed to expose the source/drain region 8 by a self-aligned contact hole process using different etch selectivities between the oxide layer and the silicon nitride layer.

A method of forming a logic device region having a silicide layer will now be described with reference to FIGS. 2A to 2F.

Figure 2A:
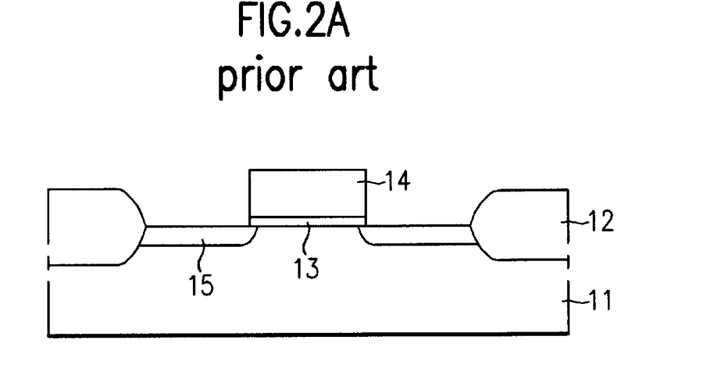
FIGS. 2A through 2F are cross-sectional views showing the process of forming a logic device region of the conventional semiconductor device.

As shown in FIG. 2A, an active region and a field region are defined in a semiconductor substrate 11, and then a field oxide layer 12 is formed on the field region. Next, a first oxide layer and a polysilicon layer are deposited on the entire surface of the substrate. Then a photoresist film is coated and then partially patterned (not shown) by photolithography. With the photoresist pattern serving as a mask, the first oxide layer and the polysilicon layer are selectively removed to form a gate oxide layer 13 and a gate line 14 on the active region.

Figure 2B:
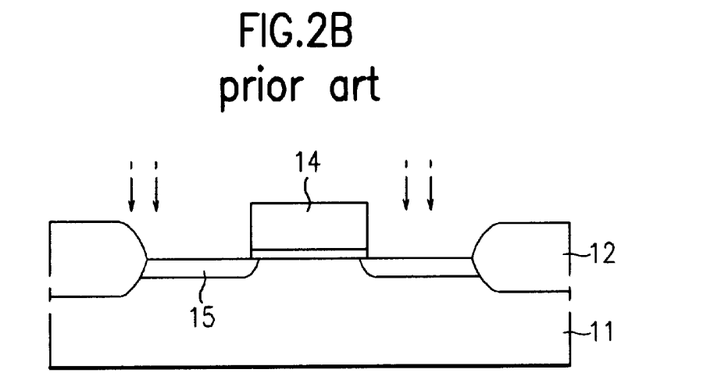

Referring to FIG. 2B, lightly doped n-type impurity ions are implanted into the substrate 11 to form an LDD region 15.

Figure 2C:
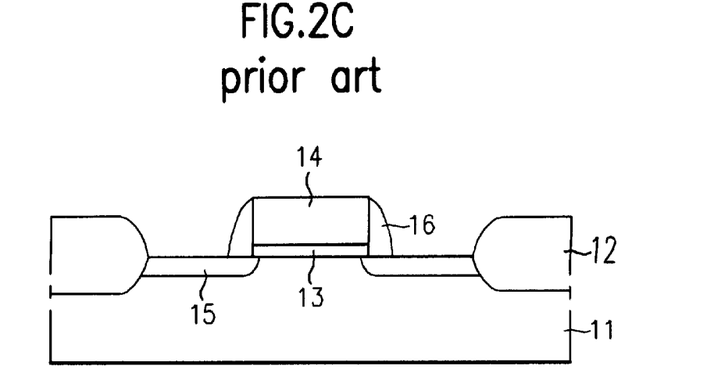

In FIG. 2C, a silicon nitride layer is deposited on the entire surface of the substrate including the LDD region 15, and then etched-back to form a sidewall insulting layer 16 on both sides of the gate oxide layer 13 and the gate line 14.

Figure 2D:
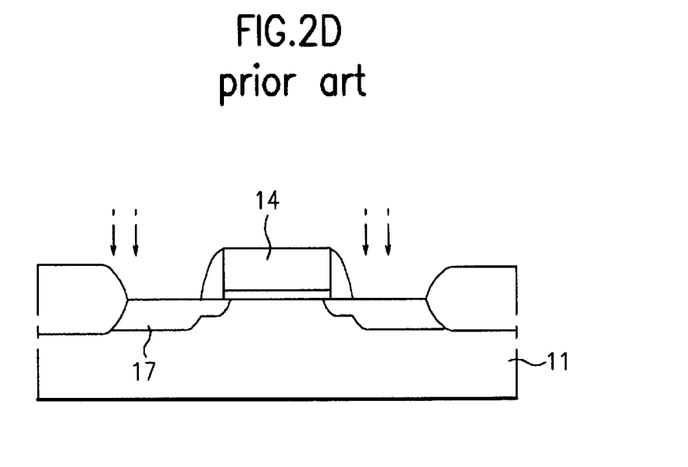

Subsequently, with the sidewall insulating layer 16 and the gate line 14 serving as masks, heavily doped n-type heavily doped impurity ions are implanted into the substrate 11 to form a source/drain region 17, as shown in FIG. 2D.

Figure 2E:
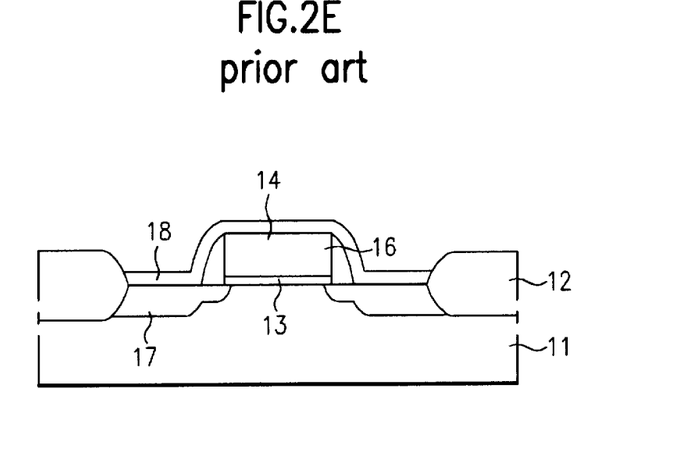
Figure 2F:
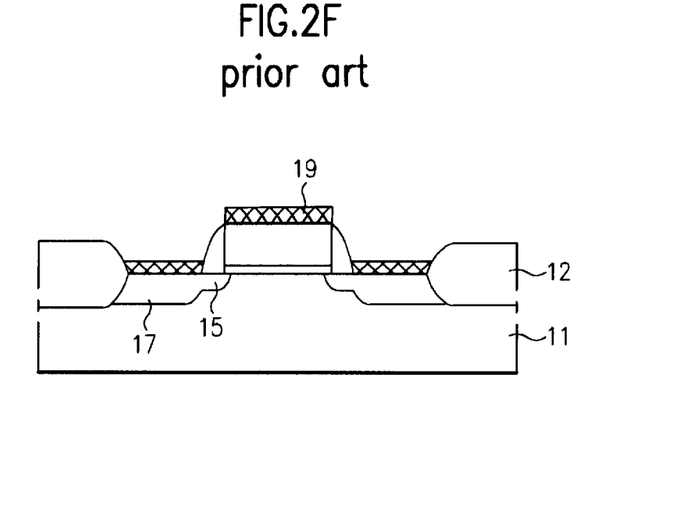

Referring to FIG. 2E, a metal layer 18 is deposited on the substrate 11. For example, titanium (Ti), cobalt (Co), or tantalum (Ta) may be used as the metal layer 18. Next, a silicide layer 19 in FIG. 2F is formed on the gate line 14 and the source/drain region 17 by annealing the metal layer 18. Thereafter, an unreacted portion of the metal layer 18 is removed from the silicide layer 19.

However, the conventional method of fabricating semiconductor devices have the following problems.

Since a sidewall insulating layer formed on both sides of the gate line in the cell region is formed of a silicon nitride layer, hot carriers are often trapped in the silicon nitride layer when a transistor is operated. Accordingly, the transistor tends to malfunction due to a high channel resistance. As a result, the device reliability is greatly lowered.

Further, a silicon nitride layer rather than an oxide layer is formed as a sidewall insulting layer in fabricating both the logic device region and the memory device region in the conventional method. Generally, the silicon nitride layer is more asymmetric than the oxide layer in crystallography. An eclectic force (for example, a Coulomb's force) dragging silicon atoms can be generated in the silicon nitride layer because of the asymmetry. Accordingly, silicon atoms in the source/drain region and the gate line move to the sidewall insulating layer in the silicon nitride layer, thereby forming a silicide in the sidewall layer. Consequently, a bridge electrically connecting the gate line and the source/drain region is formed and the semiconductor device can readily malfunction.

SUMMARY OF THE INVENTION

Accordingly, the present invention is directed to a method of fabricating a semiconductor device that substantially obviates one or more of problems due to limitations and disadvantages of the related art.

An object of the invention is to provide a method of fabricating a semiconductor device where both a cell region and a logic device region are formed on one chip at the same time, rather than separately.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for manufacturing a semiconductor device including a memory device region and a logic device region includes the steps of forming first and second gate lines having gate oxide layers on a semiconductor substrate of the cell region and the logic device, respectively, forming a sidewall insulating layer on both sides of the first and second gate lines, forming impurity regions under a surface of the semiconductor substrate at both sides of the first and second gate lines, forming a silicon nitride layer on the entire surface of the substrate including the first and second gate lines removing the silicon nitride layer over a logic device region, forming a silicide layer on the second gate line and the impurity region at both sides of the first gate line, forming an oxide layer on the entire surface of the substrate, and forming first and second contact holes on the silicide layer on the impurity region at one side of the second gate line and on the impurity region at one side of the first gate line.

In another aspect, the method of fabricating a semiconductor device having a memory device region and a logic device region on a substrate, comprising the steps of forming first and second gate lines on the substrate at the memory device region and the logic device region, respectively, forming a sidewall insulating layer on both sides of each of the first and second gate lines, forming a plurality of impurity regions in the substrate, forming a silicon nitride layer on memory device region including the first gate lines, forming a silicide layer on the second gate line and impurity regions at the logic device region, and forming an oxide layer on an exposed surface excluding portions over each one of the impurity regions at the memory device region and the logic device region, respectively.

In a further aspect, the method of fabricating a semiconductor device having a memory device region and a logic device region on a substrate includes the steps of forming first and second gate lines on the substrate, the first gate line being at the memory device region and the second gate line being at the logic device region, forming first, second, and third impurity regions on the substrate, the first impurity region being at the memory device region and the second and third impurity regions being at the logic device region, forming a sidewall insulating layer on both sides of each of the first and second gate lines, forming a silicon nitride layer on the substrate including the first and second gate lines, selectively removing the silicon nitride layer on a portion over the logic device region including the second gate line, forming a metal layer on the logic device region including the second gate line, and the second and third impurity regions, annealing the metal layer to form a silicide layer, forming an oxide layer over the memory device region and the logic device region, selectively removing the oxide layer from portions on first and second impurity regions to form first and second contact holes, respectively, and selectively removing the silicon nitride layer on the first impurity region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 3A through 3L are cross-sectional views showing the process steps of a method of fabricating a semiconductor device. In the method of the present invention, a memory device region and a logic device region are formed on the same chip at the same time, rather than separately. The left side of the drawings shows for a memory device region, while the right side of the drawings illustrates a logic device region.

Figure 3A:
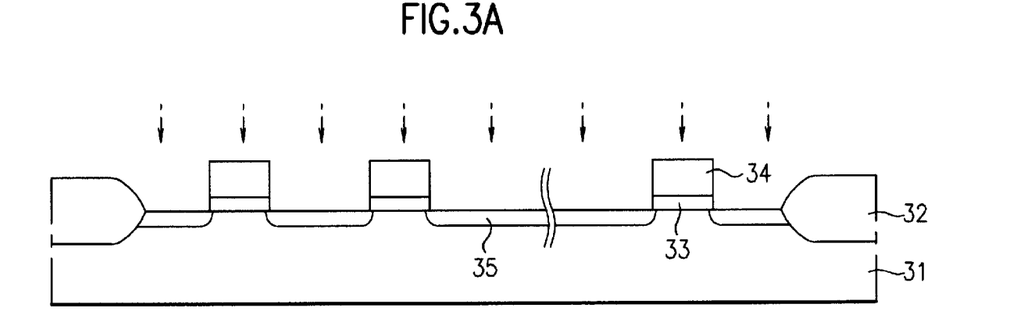
FIGS. 3A through 3L are cross-sectional views showing the process of forming a semiconductor device according to a preferred embodiment of the present invention.

Referring initially to FIG. 3A, an active region and a field region are defined in a semiconductor substrate 31, and then a field oxide layer 32 is formed on the field region. Next, an insulating layer is formed on the entire surface of the substrate using thermal oxidation. Thereafter, a polysilicon layer is deposited on the insulating layer. A photoresist film is then coated on the entire surface of the substrate and selectively removed by photolithography. With the photoresist pattern serving as a mask, the polysilicon layer and the insulating layer are etched to form a gate oxide layer 33 and a gate line 34 on the active region, respectively. Subsequently, phosphorus ions are implanted into the substrate 31 at both sides of the gate lines 34 to form an LDD region 35.

Figure 3B:
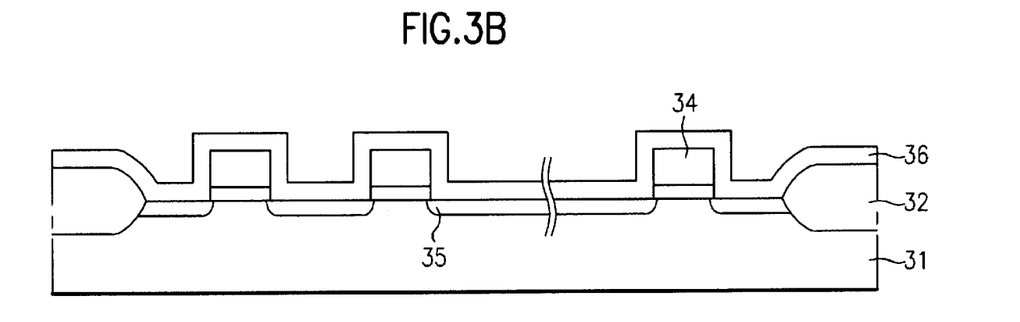
Figure 3C:
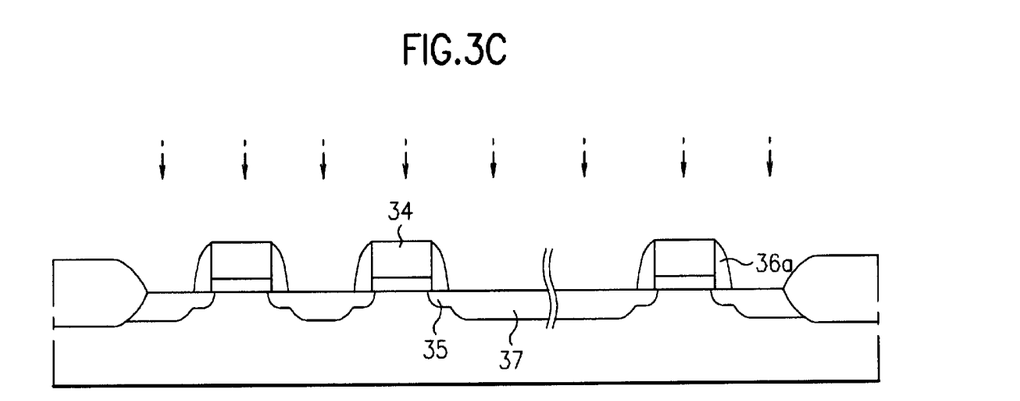

Referring to FIG. 3B, a first oxide layer 36 is deposited by chemical vapor deposition (CVD). The first oxide layer 36 is then etched-back to form a sidewall insulating layer 36a on both sides of the gate line 34, as shown in FIG. 3C. With the sidewall insulating layer 36a and the gate line 34 serving as masks, heavily doped n-type impurity ions are implanted into the substrate 31 to form a source/drain region 37.

Figure 3D:
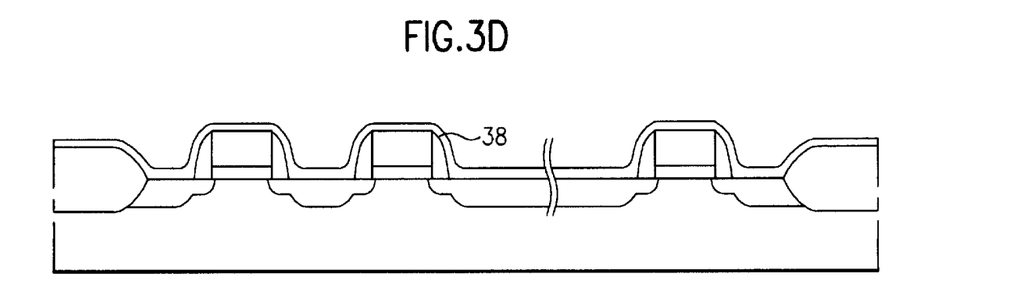

Thereafter, a thin silicon nitride layer 38, as shown in FIG. 3D, is formed on the entire surface of the substrate using CVD.

Figure 3E:
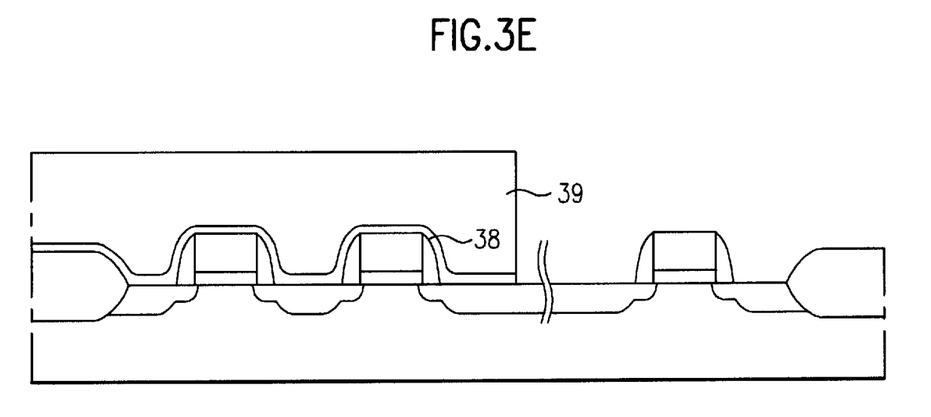

FIG. 3E, a photoresist film 39 is coated on the entire surface of the substrate and then selectively patterned to expose a portion of a logic device region. With the photoresist film 39 serving as a mask, the portion of the silicon nitride layer 38 on the logic device region is removed.

Figure 3F:
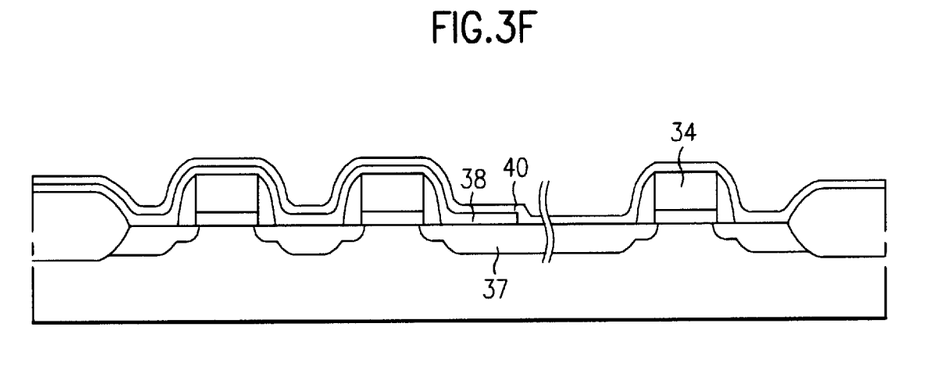

Next, a metal layer 40 is formed on the entire surface of the substrate using a sputtering method, as shown in FIG. 3F. For example, the metal layer 40 is made of Ti, W, or Ta.

Figure 3G:
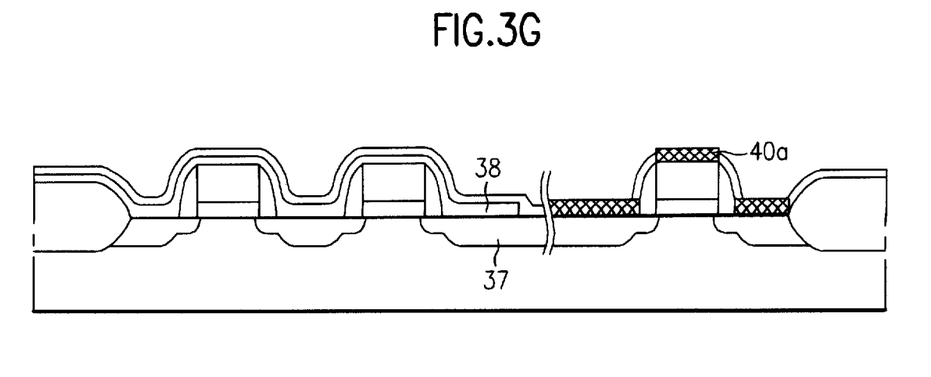

Referring to FIG. 3G, an inert gas is introduced into the vacuum chamber where the semiconductor device is fabricated and then an annealing process is performed at a temperature of 500–700° C. A silicide layer 40a is formed from the metal layer 40 on the gate line 34 and the source/drain region 37. For example, the metal layer 40 is made of Ti to form a titanium silicide ($TiSi_2$) layer. In this process, titanium is reacted with silicon to form the titanium silicide layer. Other silicide layers such as a cobalt silicide ($CoSi_2$) layer or a tantalum silicide ($TaSi_2$) layer may be used in this process.

Figure 3H:
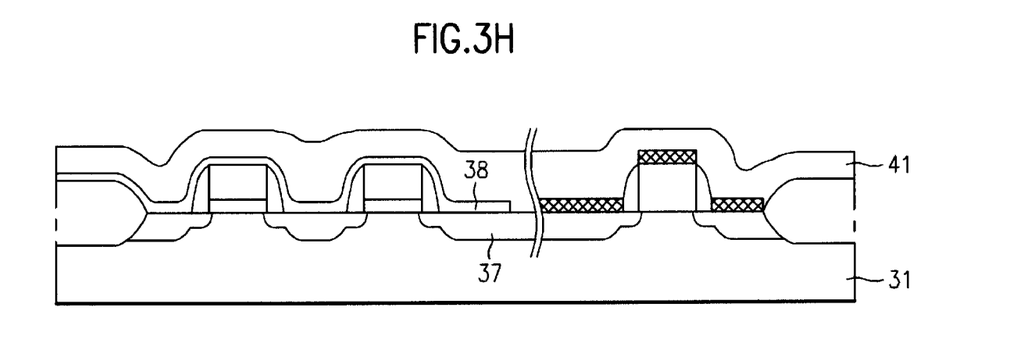

In FIG. 3H, an unreached portion of the metal layer 40 is removed by dipping in an ammonia aqueous solution. Subsequently, the silicide layer 40a is annealed at a temperature of 700–800° C. to be stabilized. A second oxide layer 41 for planarization is formed on the entire surface of the substrate including the silicide layer 40a using CVD.

Figure 3I:
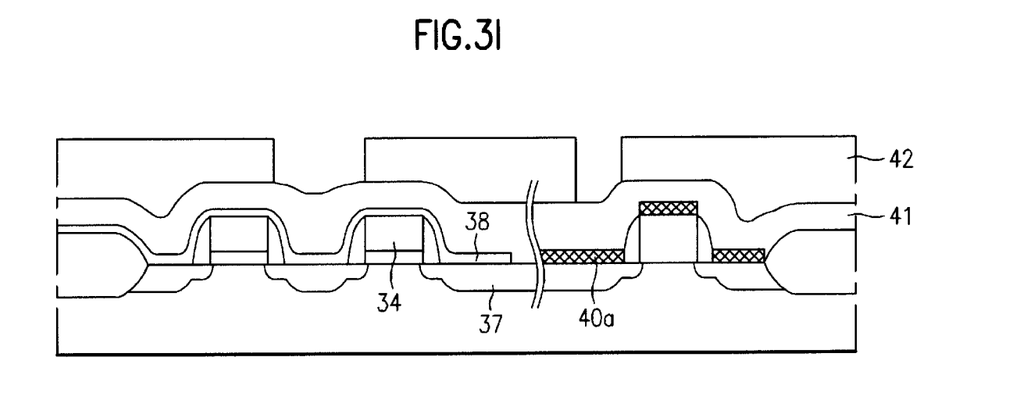

As shown in FIG. 3I, a photoresist film 42 is coated on the entire surface of the substrate and then selectively removed to expose the source/drain region at one side of the gate line 34 of the memory device region and the source/drain region 37 at one side of the gate line 34 of the logic device region. At this time, a portion of the photoresist film on the memory device region removed is larger than a portion contacting the silicide layer 40a using a self aligned process. The photoresist film of the logic device region is pad-patterned to fit into a portion contacting the silicide layer 40a.

Figure 3J:
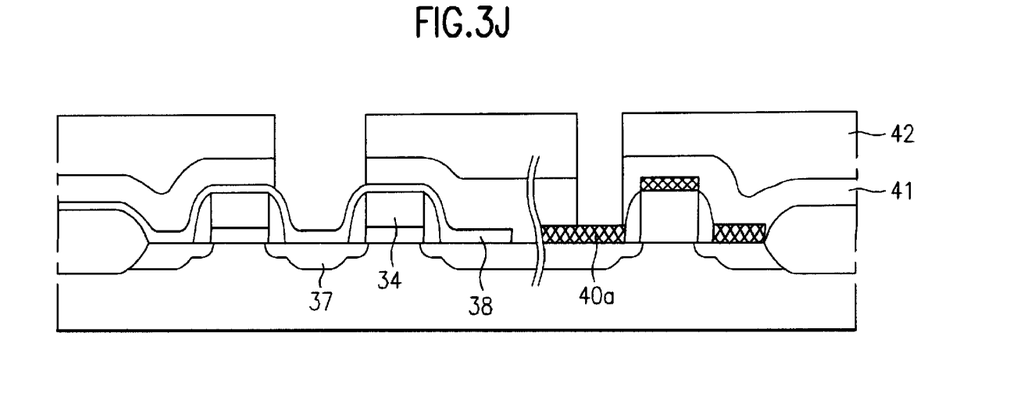

In FIG. 3J, with the photoresist pattern 42 serving as a mask, the second oxide layer 41 is anisotropically etched to expose the silicon nitride layer 38 and the silicide layer 40a. In this process, for example, a gas mixture of $CHF_3$, $C_2F_6$, and Ar is used to facilitate the etching process of the second oxide layer 41 and the silicon nitride layer 38. Thus, the silicon nitride layer 38 at the memory device region is exposed to form a self aligned contact hole, whereas the silicide layer 40a at the logic device region is exposed to form a contact hole.

Figure 3K:
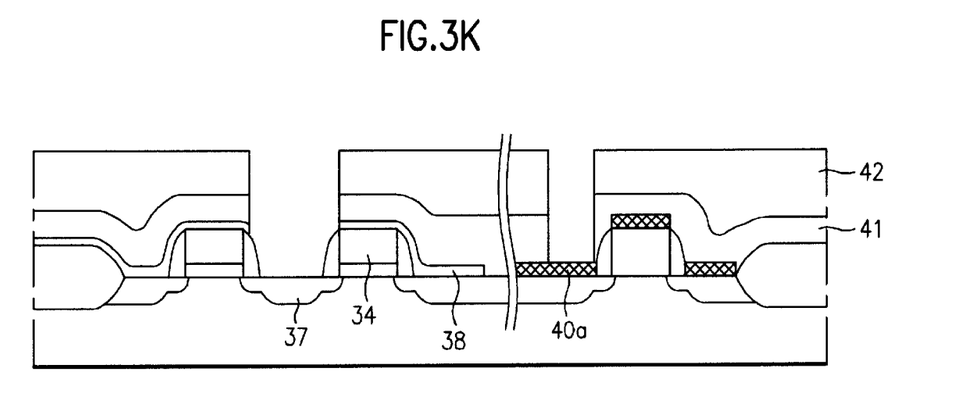

As shown in FIG. 3K, an exposed portion of the silicon nitride layer 38 is etched using a plasma etching method without applying radio frequency (RF) bias, thereby forming contact holes in the memory device region and the logic device region without damaging the semiconductor substrate 31.

Figure 3L:
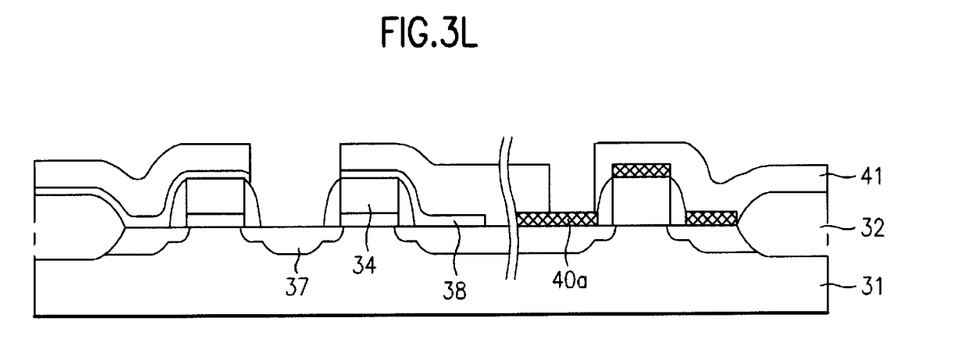

A remaining photoresist film is removed in FIG. 3L so that the self aligned contact hole in the memory device region and the silicide layer 40a of the logic device region are formed on the same chip at the same time, rather than separately.

A method of fabricating a semiconductor device of the present invention has the following advantage.

Since both a memory device region and a logic device region are formed on one chip at the same time, rather than separately, sidewall insulting layers on both sides of gate lines at the logic device region and the memory device region are made of oxide. Thus, a silicide layer on the gate line of the logic device region does not form a bridge electrically connecting the gate line and the source/drain. Accordingly, the risk of device malfunctioning is much reduced.

It will be apparent to those skilled in the art that various modification and variations can be made in the method of fabricating a semiconductor device of the present invention without departing from the spirit or scope of the inventions. Thus, it is intended that the present invention cover the modifications and variations of this invention provided they come within the scope of the appended claims and their equivalents.

What is claimed is:

1. A method of fabricating a semiconductor device having a memory device region and a logic device region on a substrate, comprising the steps of:

forming first and second gate lines on the substrate at the memory device region and the logic device region, respectively;

forming a sidewall insulating layer on both sides of each of the first and second gate lines;

forming a plurality of impurity regions in the substrate;

forming a silicon nitride layer on the memory device region including the first gate line;

forming a silicide layer on the second gate line and impurity regions at the logic device region; and forming an oxide layer over an entire surface of the substrate excluding portions over each one of the impurity regions at the memory device region and the logic device region, respectively.

2. The method according to claim 1, wherein the step of forming a silicide layer includes the steps of:

depositing a metal layer on the logic device region including the second gate line; and annealing the metal layer to form a silicide layer.

3. The method according to claim 2, wherein the metal layer includes one of titanium, cobalt, or tantalum.

4. The method according to claim 2, wherein the step of annealing is executed at a temperature of about 500–700° C.

5. A method of fabricating a semiconductor device having a memory device region and a logic device region on a substrate, comprising the steps of:

forming first and second gate lines on the substrate, the first gate line being at the memory device region and the second gate line being at the logic device region;

forming first and second impurity regions on the substrate, the first impurity region being at the memory device region and the second impurity region being at the logic device region;

forming a sidewall insulating layer on both sides of each of the first and second gate lines;

forming a silicon nitride layer on the substrate including the first and second gate lines;

selectively removing the silicon nitride layer on a portion over the logic device region including the second gate line;

forming a metal layer on the logic device region including the second gate line, and the second impurity region;

annealing the metal layer to form a silicide layer;

forming an oxide layer over the memory device region and the logic device region;

selectively removing the oxide layer from portions on first and second impurity regions to form first and second contact holes, respectively; and selectively removing the silicon nitride layer on the first impurity region.

6. The method according to claim 5, wherein the step of selectively removing the oxide layer is executed in a gas mixture of $CHF_3$, $C_2F_6$, and Ar.

7. The method according to claim 5, wherein the step of selectively removing the silicon nitride layer includes a plasma etching process without applying radio frequency (RF) bias.

8. The method according to claim 5, wherein the metal layer includes one of titanium, cobalt, or tantalum.

9. The method according to claim 5, wherein the step of annealing is executed at a temperature of about 500–700° C.

10. The method according to claim 5, wherein the step of forming first and second impurity regions includes implanting phosphorus ions to form lightly doped drain (LDD) regions.

11. The method according to claim 5, wherein the step of forming an oxide layer includes chemical vapor deposition (CVD).

12. The method according to claim 5, further comprising the step of implanting heavily doped impurity ions into the substrate to form a source/drain region prior to the step of forming a silicon nitride layer.

13. The method according to claim 5, wherein the silicide layer in the step of annealing the metal layer includes a titanium silicide ($TiSi_2$) layer, a cobalt silicide ($CoSi_2$) layer and a tantalum silicide ($TaSi_2$) layer.

14. The method according to claim 5, further comprising annealing the silicide layer in a temperature of about 700–800° C. after the step of annealing the metal layer.

15. The method according to claim 5, further comprising the step of removing an unreacted portion of the metal layer from the silicide layer after the step of annealing the metal layer.

16. The method according to claim 15, wherein the step of removing an unreacted portion of the metal layer includes the step of dipping the unreacted portion in an ammonia aqueous solution.

* * * * *